United States Patent [19]

Musiani

[11] Patent Number: 4,718,461
[45] Date of Patent: Jan. 12, 1988

[54] DEVICE FOR BENDING THE LEADS OF ELECTRICAL AND/OR ELECTRONIC COMPONENTS

[75] Inventor: Mario Musiani, Bologna, Italy

[73] Assignee: Arcotronics Italia, S.p.A., Bologna, Italy

[21] Appl. No.: 923,836

[22] PCT Filed: Nov. 20, 1985

[86] PCT No.: PCT/GB85/00531
§ 371 Date: Oct. 20, 1986
§ 102(e) Date: Oct. 20, 1986

[87] PCT Pub. No.: WO86/03371
PCT Pub. Date: Jun. 5, 1986

[30] Foreign Application Priority Data

Nov. 20, 1984 [IT] Italy ................................ 3626 A/84

[51] Int. Cl.[4] .............................................. B21F 1/00
[52] U.S. Cl. .................................................. 140/105
[58] Field of Search ....................... 140/105; 29/33 M

[56] References Cited

U.S. PATENT DOCUMENTS 4,361,025 11/1982 Foster et al. ...................... 140/105
4,462,435 7/1984 Whitley .............................. 140/105
4,515,001 5/1985 Zahn .................................. 140/105
4,610,279 9/1986 Stewart ............................. 140/105

*Primary Examiner*—Lowell A. Larson
*Attorney, Agent, or Firm*—Spencer T. Smith

[57] ABSTRACT

The device comprises a bank 40 of bending stations 40a positioned side by side and fitted with fixed benders 23 and moving benders 90.

Each station 40a is responsible for bending at least one lead 50a of an electrical/or electronic component 50 inserted in it in such a way that the leads 50a of the component 50 are subsequently orientated in the same direction spaced at a pre-established pitch P.

The device includes means for positioning the selected bending station 40a in a first station S1 in which first means 70 feeds a pre-established component 50 to the selected bending station 40a, units for handling the moving benders 90, units for rotating the bank 40 so as to position the selected bending station 40a opposite a second station S2, and finally units for moving the bank towards the said second station S2 to enable second means 75, intermittently passing through the latter station, to hook the leads 50a, orientated as mentioned above, of the component 50.

21 Claims, 16 Drawing Figures

DEVICE FOR BENDING THE LEADS OF ELECTRICAL AND/OR ELECTRONIC COMPONENTS

TECHNICAL FIELD

This invention falls within the vast technical field concerning the automatic assembly of electrical and/or electronic components in a printed circuit; for this operation, the leads of each component must be parallel to each other so that it is possible, and also easier, to insert the leads into their respective holes in the printed circuit.

This may be achieved using two different configurations; in the first configuration, both leads are bent perpendicularly with respect to the body of the component, and in the second configuration only one lead is bent.

It is known that the above-mentioned components (e.g. transistors, diodes, capacitors, resistors, etc.) are supplied either with the leads already in one of the above configurations (with the ends of the leads hooked onto a mounting strip or bar), or in the axial configuration, i.e. with the leads co-axial to the body of the relevant component. In the latter case, two bars are supplied, to which the opposite ends of the leads are hooked.

In the case where the components are supplied with the leads in an axial configuration, the leads must be worked (normally by bending) into one of the two configurations mentioned above, with a pre-established distance (pitch) between the leads thus orientated.

The particular technical sector embracing this invention concerns the technical problem put forward above, i.e. the bending of leads in an axial configuration in which the leads are orientated in the same direction and in accordance with pre-established pitches.

BACKGROUND ART

One such device consists of two paralle plates comprising two grooves, one on each plate and one opposite the other.

A component, whose leads must be positioned to line up with the said grooves, is placed on the ends—which are facing the same way—of the plates.

By making the component body slide inside the plates (e.g. by means of a pressure device), the leads are made to press against the plates; this causes the leads to bend in the same direction and to slide in their respective grooves; in the configuration thus obtained, the pitch of the leads is equal to the distance between the grooves.

This is certainly not an ideal solution as regards 'centering' the component body in relation to the leads made parallel by the above-mentioned method.

In another known type of the said devices, the action of the pressure device is assisted by two tappet members in contact with the ends of the component body and moving in synchrony with the pressure device; in this technical solution, the component body is 'centred' with respect to the leads, and at the same time the leads are bent and perfectly parallel.

Both of the above-mentioned devices have constant pitch, which undoubtedly causes difficulties for the following reasons.

To illustrate the above, it should be remembered that the pairs of bars between which the components—with the co-axially-situated leads—are integrally interposed, are arranged to lie parallel and must be capable of being reeled for transport. In order to bend the leads to the desired configuration the components must be detached from the bars and supplied by a suitable loader, for the above-mentioned reasons to a corresponding bending device designed to achieve the desired lead spacing; the constructional difficulties, space requirements and capital and maintenance costs are evident. In particular, if different pitches are required for the same component, there must be as many loaders as desired pitches, each loader being associated with a corresponding bending device. This is certainly not ideal in terms of space utilization since, as is known, the frequency of use of components which are the same but with different pitches is irregular, whereas it is naturally necessary for a 'loader' whose pitch has the minimum frequency of use, to be connected to the device. In the case of components with bodies of different sizes but with the same pitch, it is necessary to use as many devices for 'centering' as mentioned above, the body with respect to the leads orientated in parallel and in the same direction. These difficulties are heightened in the case where the leads are to be bent in accordance with either one of the above-mentioned configurations.

An object of this invention is to provide a device for bending the co-axially-situated leads of electric and/or electronic components which is made in such a way as to be universal, i.e. suitable for working both leads to bend them in the same direction, or one lead to bend it towards the other lead, with the possibility of achieving this in accordance with a range of pre-established pitches for a variety of dimensions of the bodies of the components.

DISCLOSURE OF INVENTION

The invention provides in one aspect, a device for bending the leads of electric and/or electronic components supplied at a first station S1 by means with leads coaxial relative to the body of the relevant components and with the components having a pre-established spatial orientation characterised in that the device comprises: a bank comprising a plurality of bending stations positioned side by side each for receiving an appropriate component, the stations being associated with corresponding fixed benders and moving benders; selection means for longitudinally moving the bank to position a selected bending station at the first station S1; means controlling the moving benders to define for them, in conjunction with the fixed benders: a rest position for receiving the appropriate component in the selected bending station, an intermediate position for clamping at least one lead of this component in the selected bending station in synchrony with disengagement of the first means from the component, and lastly a final position for bending at least on lead and determining a predetermined pitch 'P' between the leads; rotating means for rotating the bank of bending stations through a preselected angle, acting in synchrony with the means for controlling the moving benders, the rotating means orientating the selected bending station opposite a discharge station S2; a first carriage supporting the bank and relevant selection means, the rotating means and the control means; means for moving the first carriage between a first position enabling the selected bending station to be positioned in the first station S1, and a second position, reached in synchrony with the rotating means determining the position of the selected bending station in the above-mentioned first station S1, disengagement of the moving benders from the leads component occurring in the second position;

A preferred device embodying the invention is arranged to automatically receive the electric and/or electronic components, with leads in the axial configuration, from first, feeding means which can be positioned intermittently at a first station, and after bending and the resulting orientation of the leads in the same direction, to feed the components to a second, receiving means which can be positioned intermittently in at a second station; all this being performed reliably and at a high speed of operation.

Preferably a device embodying the invention, in addition to fulfilling the above, is such as to ensure optimum 'centering' of the component body with respect to the relevant leads, in the case where the latter are both bent perpendicularly to the component body.

A preferred device carries out the above without involving the formation of 'rejects'; i.e. leads not orientated in the same direction.

It is also desirable that a preferred device is structured in such a way as to be easily controlled by a microprocessor unit.

There now follows a detailed description to be read with reference to the accompanying drawings of a lead bending device embodying the invention. It will be realised that this device has been selected for description to illustrate the invention by way of example and that the invention may reside in any novel feature or combination of features disclosed.

BRIEF DESCRIPTION OF DRAWINGS

In the accompanying drawings:

FIG. 11 diagrammatically represents, in accordance with the same section of FIG. 5, a second use characteristic of this device whereby the leads can be bent, as illustrated diagrammatically in FIGS. 12a and 12b, which figures being obtained similarly to FIG. 7;

The illustrative lead bending device comprises a supporting structure 1 to which a horizontal bracket 2 is attached; parallel longitudinal guides 3 are secured onto two parallel sides of the bracket, one per side; small wheels 4 supporting a carriage 5 run on the said guides; a connecting rod 6, whose operation is known, enables the carriage to be moved in direction H.

Two vertical parallel columns 7 attached to the carriage 5 extended perpendicular to the direction H and act as guides for a further carriage 8.

Figures 8, 13:
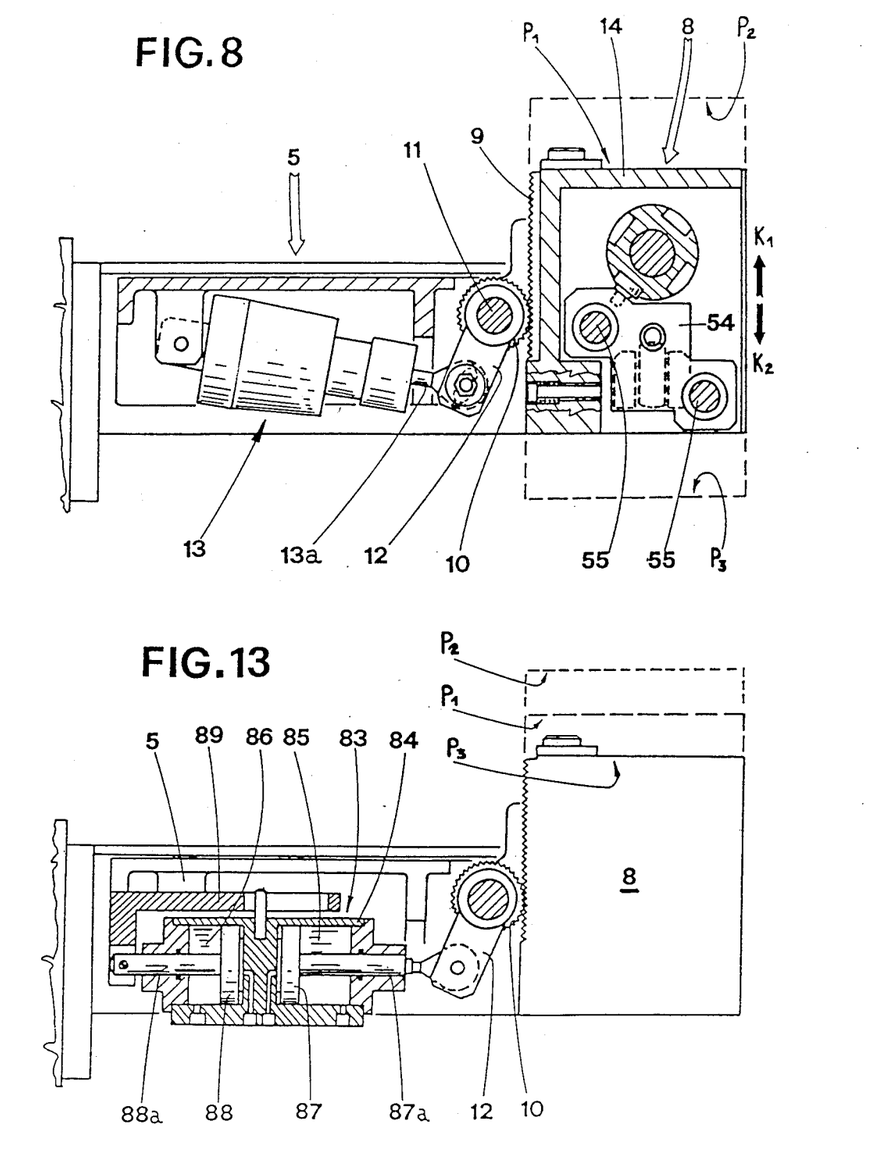
FIG. 8 shows a diagrammatic view in plan on line III—III plan of FIG. 1.
FIG. 13 shows a constructional variant permitting the second use shown in FIGS. 11, 12a and 12b.
Figure 9:
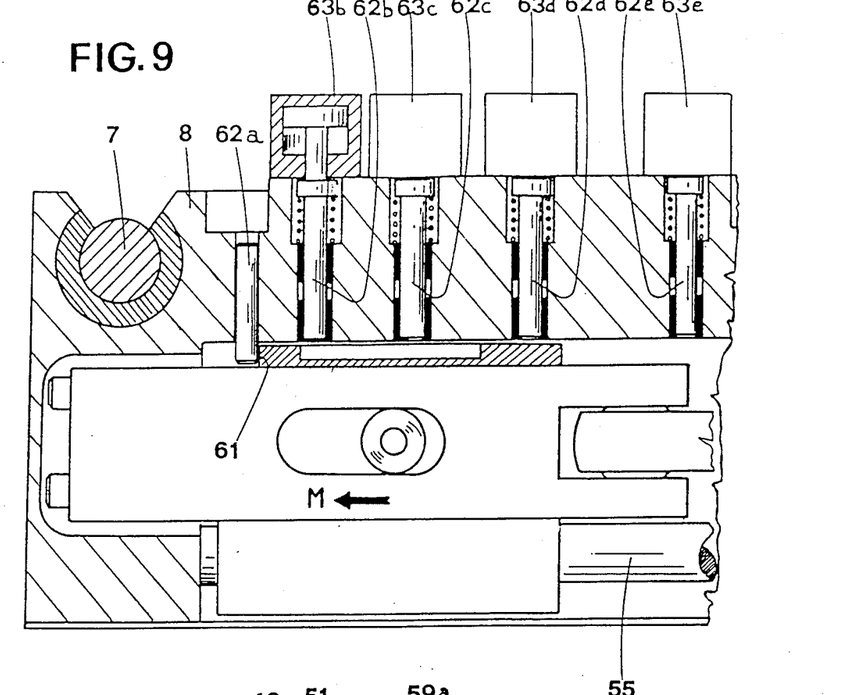
FIG. 9 shows a diagrammatic view in section on line IV—IV of FIG. 2.

Two vertical racks 9 are secured onto the side of the carriage 8 facing the structure 1; these racks engage with two pinions 10 keyed onto a shaft 11 which is supported for rotary movement by the carriage 5; an arm 12 is keyed onto the shaft 11 and is operated by the piston rod 13a of a pneumatic jack 13 (see FIG. 8).

Actuation of the jack 13 causes the shaft 11 to rotate and, as a result of the above, the carriage 8 consequently to move (K1 direction); stopping the jack causes the carriage 8 to move in direction K2, opposite to K1.

Thus two end positions P1 and P2 are determined for carriage 8, which will be described below.

The support structure 14 of the carriage 8 is basically tubular in shape.

At one end, the said structure houses a motor 15 (of the rotating cylinder type, actuated pneumatically) whose shaft 16 can rotate in either direction through a pre-established angle; in this case ninety degrees as will be explained below.

The end of a metal tube 17 is attached to the shaft 16; on opposite sides of this metal tube, there are two longitudinal grooves 18 in which rollers 19 slide, and pins 20 carrying the rollers are secured to a shaft 21 (or selection shaft as will be stated below); in this way the rotation of the metal tube 17 entails the rotation in the same direction of the shaft 21, whilst the latter can move axially with respect to the metal tube 17.

The metal tube 17 and the shaft 21 are naturally supported by the relevant bearings, not marked, located inside the tubular structure 14.

The centre part and the part opposite that attached to the metal tube 17 of the shaft 21 are tubular in shape so as to form a bush 21a: this bush extends beyond the structure 14.

The outer end of the bush 21a supports an overhanging box casing 22 from which, on the side opposite the said bush, there emerge two longitudinal bars 23, joined at the external end and shaped in such a way as to form fixed benders of the device, as will be explained below.

With bearings 24 interposed, the bush 21a houses a bush 25 (or internal bush) which in turn houses a rod 26.

A side 27 of a parallelogram linkage 28 is secured to the end of the rod 26 situated inside the box casing 22; this linkage also comprises two connecting rods 29 and a further side 30 parallel to the above side 27.

Fixed to the side 27 is a pin 31 sliding inside a slot 32 made in a wall of the casing 22.

One of the above-mentioned connecting rods 29 comprises a toothed section 33 which engages in a rack 34 parallel to the axis of the internal bush 25 and integrally joined to it by means of a transversal arm.

Suitable bearings 35 prevent the rack 34 from rotating with respect to the box casing 22.

The axial movement of the rod 26 is determined by the length of the slot 32.

The rotation of the bush 21a, in addition to causing the rotation of the casing 22 (with which it is integral), also causes the rotation of the rack 34—bush 25 assembly, the parallelogram 28 and the connected rod 26.

A core 36 is integral with the side 30 of the jointed parallelogram 28; this core extends longitudinally and is positioned between the above-mentioned bars 23 with the possibility of sliding longitudinally, and towards the outside, in accordance with F in relation to the bars.

With reference to FIGS. 3 to 7, a bank 40 of bending stations 40a (for example 5 stations), and associated fixed benders (bars 23) and moving benders 90, are described.

The opposite surfaces of the bars 23 form seats 37 (one for each bending station 40a), each of which is delineated longitudinally by two portions of opposite surfaces 38, parallel to each other, the width (or transversal dimension) of the said seats being equal to a pre-established value, or pitch P, which will be described below.

Figures 3, 4, 5, 6, 7:
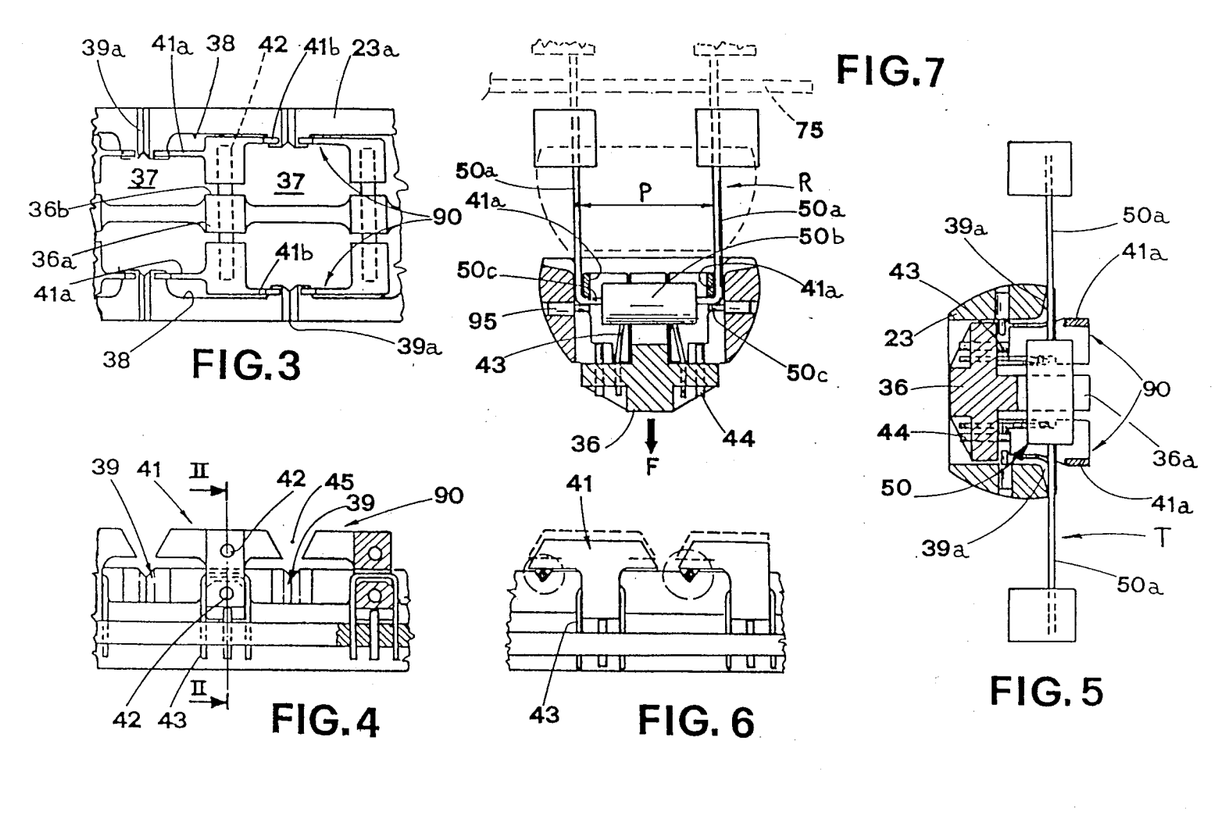
FIGS. 3 and 4 show details of parts A and B respectively of FIGS. 2 and 1.
FIG. 5. shows the position for insertion of a component in a selected bending station, in plan on line II—II of FIG. 4.
FIG. 6 shows the position in which moving benders lock the leads in a seat of the selected station in accordance with the view of FIG. 4.
FIG. 7 shows a final configuration adopted by the leads, in accordance with the same view of FIG. 5.

The above-mentioned surfaces comprises two opposite grooves 39, with triangular section, extending in both the direction of the height of the bars 23 and along the corresponding top surfaces 23a of the latter (FIGS. 3 and 4).

Pairs of moving benders 90 are attached to the above-mentioned core 36 (five in the cases in question), each pair consisting of two opposite wings 41 extending longitudinally and supported by two transversal pins 42 (connected to a corresponding protuberance 36a on the core 36) with the possibility of sliding transversally on the pins under control of spring units 43; the pins are inserted, at different heights, in the core 36 and are positioned at the beginning of each seat 37 starting from the side 30 of the parallelogram 28 (FIGS. 3 and 4).

The wings 41 are bent longitudinally so that the relevant half-portions 41a and 41b comprise two consecutive seats 37; because of the action of the spring units 43 on the wings, and also stops 44 which limit the outward travel of the wings, it is possible to set the half-portions 41a and 41b to a rest position so that the relevant external longitudinal surfaces are aligned with the surfaces 38 of the corresponding seats 37.

It is also stated that the end parts of the half-portions 41b relating to one pair of wings 41 and the half-portions 41a of the following (or preceding) pair of wings, are angled so as to form a tapered inlet 45 centred at rest on the plane of symmetry of two triangular grooves 39 relating to a seat 37.

Figures 1, 1A:
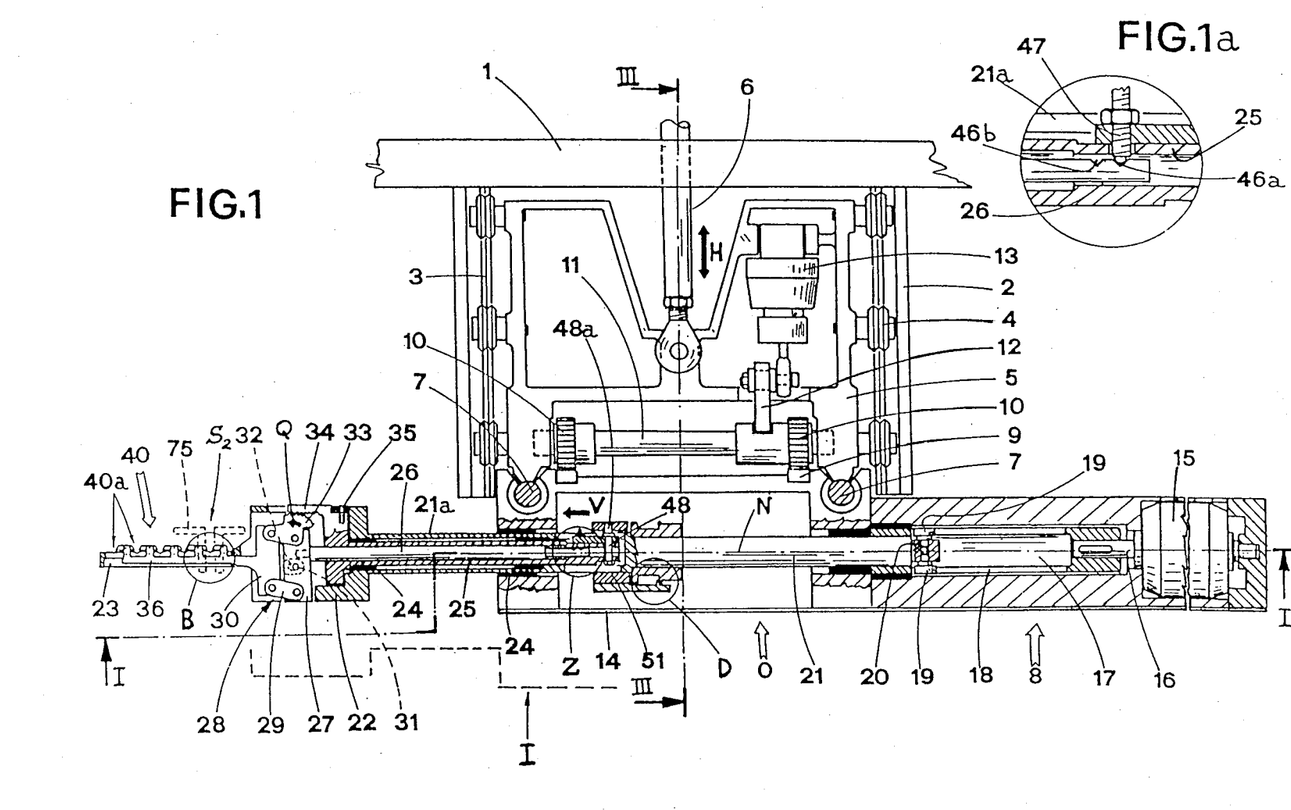
FIG. 1 shows a diagrammatic cross-sectional view from above of a device embodying the invention.
FIG. 1a shows a detail of part Z.

Near its inner end, the rod 26 comprises two adjacent notches 46a and 46b; a dowel 47 passes through a hole made in the wall of the internal bush 25 (see FIG. 1a) and fits into these notches.

The dowel 47 is secured by resilient means e.g. spring units, not illustrated, which hold its bottom end in contact with the rod 26, inserted in one or other notch.

Level with and near the inner end of the internal bush 25, the bush 21a (of the shaft 21) comprises openings such as to permit the free movement of a transversal pin 48 keyed onto the internal bush 25; one end 48a of the pin is inserted into an eccentric groove 49 in the internal surface of a sleeve 51 encircling the above-mentioned bush 21a.

Figure 2:
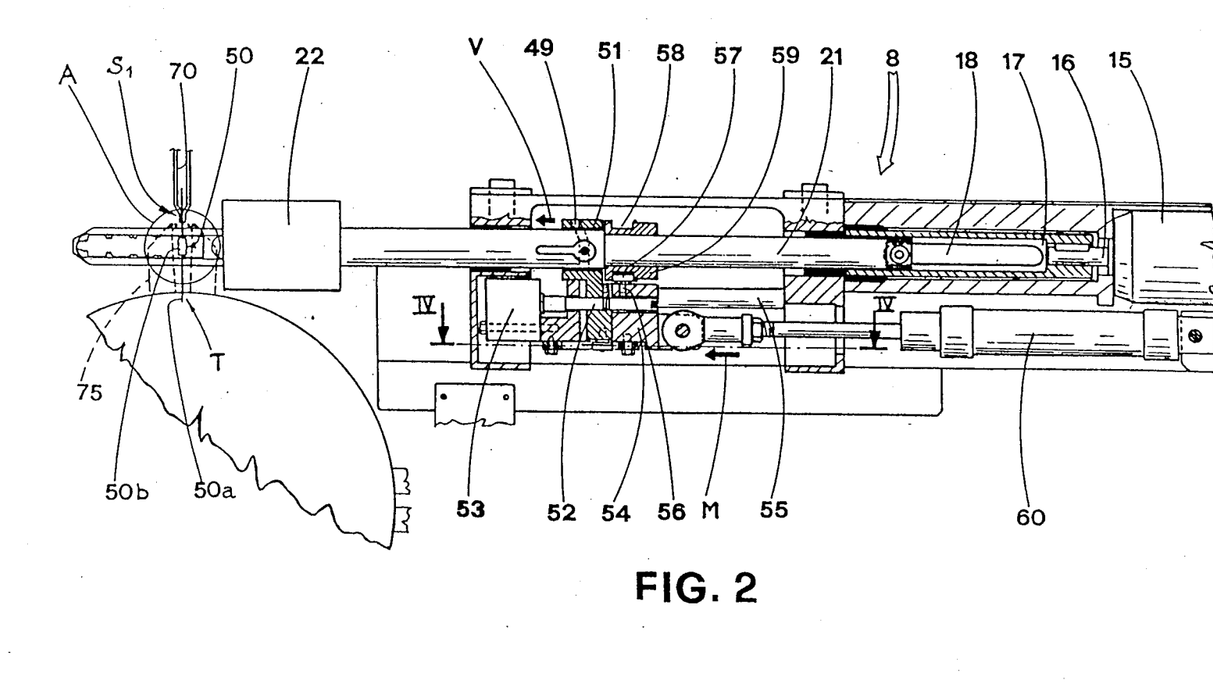
FIG. 2 is a diagrammatic view on line I—I of FIG. 1.

The said sleeve (FIG. 2) is integral with a rod 52, actuated by a pneumatic jack 53, the latter being secured to a slide 54 running longitudinally along two longitudinal rods 55.

A pin 56 is secured to the slide 54; this pin supports an idler wheel 57 housed in an annular groove 58 located in a collar 59 which is keyed onto the shaft 21.

Level with the annular edge, an external shoulder 59a (FIG. 10) comprises radial grooves 64, each at 90° with respect to the previous or following groove, through which a small pin 65 can pass, supported with rotary movement by bearings 66 mounted on an arm 67 fixed to the sleeve 51 (FIG. 10); the function of this small pin will be described below.

The slide 54 is moved by means of a pneumatic jack 60 housed inside the tubular structure 14 and secured to the latter in a known manner.

The slide 54 is equipped with a ledge 61 responsible for intercepting, in consequence of the slide's movement in direction M, one of several tappets 62a, 62b, 62c, 62d or 62e (for example five tappets). Tappet 62a is fixed whilst the remaining tappets are movable and bear on pistons of corresponding pneumatic jacks 63b, 63c, 63d and 63e.

Since the movements of the slide 54 cause movements in the same direction of the above-mentioned shaft 21 and of the units connected to the latter, it ensues from the above that the actuation of a pre-established jack 63b, 63c, 63d or 63e leads to the corresponding spatial positioning of the above-mentioned bank 40 level with a first station S1.

Naturally if all the above-mentioned pneumatic jacks are inactive, the position of the bank is determined by the interception of the ledge 61 by the fixed tappet 62a.

This device is intended to work on the leads 50a of an electrical and/or electronic component so as to bend the leads from the axial configuration T (FIG. 2) to the so-called radial configuration R (FIG. 7), in which the leads are bent in the same direction perpendicularly to the axis of the body 50b of the component 50 and in accordance with a pre-established distance from each other, or pitch P.

It ensues that the device in question is connected to a first means, for which a gripper has been indicated in general terms, suitable for intermittently transferring the above-mentioned components 50 (one at a time) from suitable feeder channels (not illustrated; for example arranged in two linear magazines situated opposite each other) to the first station S1 (FIG. 2) in which each component (with its leads in the T configuration) is held, by one of its leads, by a gripper 70 and—a notable fact—is orientated in accordance with a pre-established spatial position.

Figure 14:
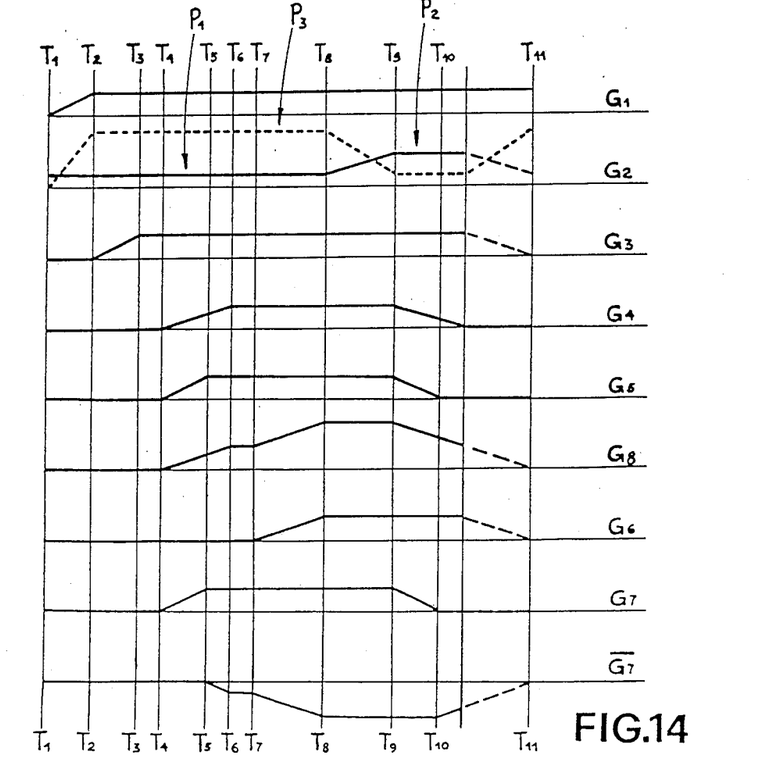
FIG. 14 is a qualitative illustration of a phase diagram of the illustrative device.

The operation of the device will now be described with reference to a phase diagram shown in FIG. 14. In the graphs of FIG. 14, included purely by way of qualitative indication, the inclined sections correspond to movements of the relevant units, whereas the horizontal sections correspond to static situations of the same units.

Graph G1 refers to the carriage 5.

Graph G2 refers to the carriage 8.

Graph G3 refers to the axial movements (selection) of the shaft 21, and naturally of the units connected to it.

Graph G4 refers to the axial movements of the sleeve 51.

Graph G5 refers to the axial movements of the rod 26 with respect to the internal bush 25.

Graph G6 refers to the rotation of the above-mentioned shaft 21.

Graph G7 refers to the axial shifts of the benders 90 (wings 41) with respect to the bars 23 (fixed benders).

Graph G7 refers to the insertions (lowerings) of the benders 41 with respect to their relevant seats 37.

Finally G8 refers to the axial movements of the internal bush 25 with respect to the axis of the external bush 21a which, as mentioned above, is an extension of the shaft 21.

At instant T1, by the operating of the connecting rod 6, the carriage 5 is brought from an inoperative position I (partially indicated by a dashed line in FIG. 1) to the operative position O (instant T2): see graph G1 in FIG. 14.

At instant T1, assuming the carriage 8 to be in the position P1 in which the bank 40 includes the first station S1, the jack 60 (selection) is actuated; as mentioned above, this causes the slide 54 to move in direction M until it is intercepted by the ledge 61 of the selected moving tappet 62a, b, c, d, e; the said ledge is such as to position the selected bending station 40a level with the station S1; this position is obtained at instant T3—see graph G3 in FIG. 14.

It is pointed out that in the situation just described, the wings 41 are as far out as possible from their seats 37 (since the core 36 which supports them is in the position of maximum insertion in the bars 23) and are at the maximum distance from each other (imposed by the springs 43): see FIGS. 3 and 5.

The foregoing permits the cylindrical body of 50b of the component 50 (whose leads are in the axial configuration T) to be inserted into the seat 37 of the selected station 40a (see FIG. 5); this insertion is facilitated by the fact that the leads 50a are (possibly) guided by the pair of tapered inlets 45. In the graphs of FIG. 14, it has been assumed that this insertion occurs during the interval T3-T4.

Figure 10:
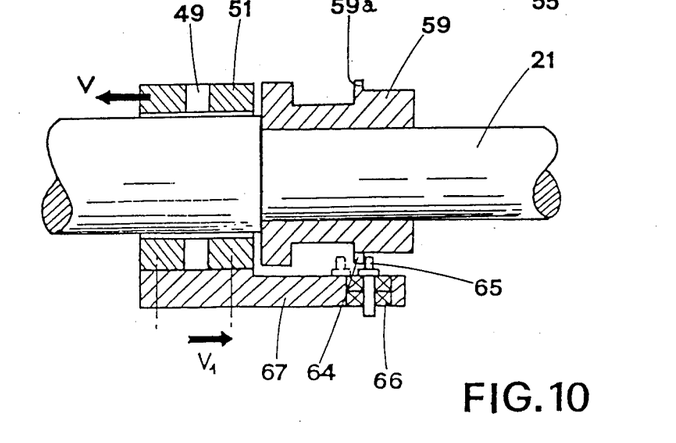
FIG. 10 shows a constructional detail of part D in FIG. 1.

At instant T4, the jack 53 is actuated, causing the sleeve 51 to move in direction V; during this movement the pin 65 travels along a corresponding groove 64 in the shoulder 59a of the collar 59: this situation is marked by a dotted line in FIG. 10.

The movement of the sleeve, in consequence of the engagement between the pin 48, integral with the internal bush 25, and the eccentric groove 49 located in the sleeve itself, causes the movement in the same direction of the said internal bush 25 which, by means of the dowel 47, pulls the rod 26; in this way both the toothed section 33 and the parallelogram 28 move in a direction V, and similarly the core 36 integral with the side 30 of the parallelogram: it ensues that the portions 41a relating to the selected seat 37, move parallel to each other (see FIG. 6) and are brought above the leads 50a—this is illustrated in graph G7 in FIG. 14, period T4-T5.

Pin 31 coming up against the front surface of the slot 32 (instant T5, graph G5 in FIG. 14) causes the rod 26 to stop; since the travel of the sleeve 51 is greater than the axial travel permitted for the rod 26, the result is that the internal bush 25 continues it movement until instant T6 (graph G4 in FIG. 14); the dowel 47 emerges from the notch 46a and at instant T6 is in an intermediate position between notches 46a and 46b.

Figures 11, 12A:
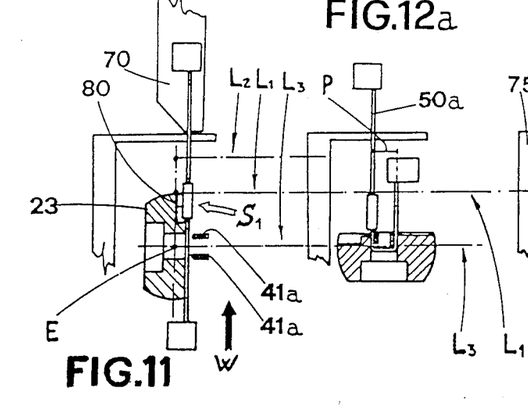

In the interval T5-T6, the connecting rods 29 are obliged to turn in direction Q as a result of the engagement between the toothed section 33 and the rack 34; this causes a first insertion (lowering) of the above-mentioned portions 41a towards, until they gently press against, the underlying leads 50a; see FIG. 6 and also period T5-T6 of graph G7 in FIG. 11 which illustrates the lowering of the wings 41. In this situation, the gripper 70 is disengaged from the lead 50a which was inserted between the prongs of the gripper; this disengagement is fully completed by instant T7.

At instant T7 the motor 15 is actuated, causing a 90° rotation of the relevant shaft 16 and, as mentioned above, the external bush 21a; as already described, this causes the box casing 22 and the connected bank 40 to rotate 90° with respect to the axis N (see graph in FIG. 14).

The rotation of the casing 22 causes the rotation of the internal bush 25 which, because the pin 48 engages with the groove 49 of the sleeve 51, is obliged to move in accordance with V simulataneously with the said rotation.

The pitch of the eccentric groove 49 is such as to impose movement of the bush 25 (in consequence of the 90° rotation of the bush itself) of a value equal to the difference between the maximum travel estimated for the bush 25 and the axial movement imposed on the sleeve 51 by the jack 53.

During the said rotation, because of the coupling between the groove 49 and pin 48, the sleeve 51 is subjected to a resistant force which opposes the pulling force generated by the jack 53 on the sleeve; this resistant force is absorbed by the shoulder 59a of the collar 59, since the above-mentioned pin 65, integral with the sleeve 51, presses against the internal surface of the said shoulder.

The movement of the internal bush 25 in direction V, in relation to the rod 26, causes a further rotation of the connecting rods 29 in direction Q: the core 36 consequently emerges even further (it is lowered towards F) from the bars 23 (its axial movement consequent to the rotation of the side 30 of the parallelogram 28 may be considered negligible), and the wings 41—carried by the core—move (they are lowered towards F) even further towards the inside of the relevant seats 37: see period T7-T8 of graph G7 which illustrates the lowering of the moving benders, and also period T7-T8 of graph G8 which illustrates the further movement of the bush 25.

As a result of their movement, the portions 41a relating to the selected bending station intercept the leads 50a near the sections 50c adjacent to the body 50b, and pull the body 50b downwards until the said sections 50c come up against the tappet stops 95, co-axial with respect to each other, in the grooves 39 (see FIGS. 5 and 7). This causes the portions 41a to draw closer to each other, overcoming the relevant springs 43, and the portions of the leads 50a outside the sections 50c to bend in the same direction, perpendicularly to the axis of the body 50b.

This bending is facilitated, and also optimized, by the fact that it is due to the countering and guiding action of the grooves 39, where the bending actually occurs, in conjunction also with the pulling and countering action of the portions 41a of the wings 41 on the other hand; the countering function of the wings 41 results from the fact that when the wings yield, they come up against the ends 36b in the protuberance 36a in the core 36. The above is demonstrated even more clearly by a comparative examination of FIGS. 6 and 7; in particularly it may be observed in FIG. 7 that the pitch P, the distance between the leads 50a bent in accordance with the radial configuration, is dependent only on the distance between the opposite surfaces 38 of the selected seat 37.

The bending of the leads is completed when the bank 40 is turned 90° from its initial position; in this position the dowel 47 is inserted in the notch 46b; this is because the reciprocal distance between the grooves 46a and 46b is equal to the difference between the maximum axial travel estimated for the bush 25 and the axial travel of the rod 26.

The particular conformation of the bending station and the units associated with it (fixed and moving benders, springs 43, etc) and the ways in which the bending cycle occurs, have a positive effect on the 'centering' of the body 50b of the component in relation to the bent leads.

The selected bending station 40a, thus rotated 90°, comes to be positioned opposite a second station S2 through which known second means 75, for example grippers carried by a turntable, intermittently pass; these are responsible for hooking the leads 50a of components 50 with the above-mentioned leads already bent at right angles with respect to the relevant body 50b.

At instant T8 the jack 13 is actuated to operate the carriage 8 which is brought, and with it the bank 40, to the position P2 (instant T9, see graph G2 of FIG. 14); in this position the selected station 40a is level with the station S2, and in particular the leads 50a are inserted between the prongs of the said gripper—this is shown by a dotted line in FIG. 7.

At this point the said prongs close, and the moving benders are simultaneously disengaged from the leads 50a.

This occurs at instant T9 when the jack 53 which operates the sleeve 51 is stopped; the result is that the latter moves in direction V1, opposite to V, a movement not impeded by the pin 65 which moves along a groove 64 in the collar 59.

The sleeve pulls, towards V1, the internal sleeve 25 and the rod 26 (since, as mentioned above, the dowel 47 is inserted in the notch 46b); this causes the core 36 to move in direction V1 until the pin 31 comes up against (instant T10) the front end of the slot 32; this movement is sufficient to enable the portions 41a to disengage from the leads 50a.

At instant T10 the carriage 8, by means of the jack 13, is again brought to the position P1 in order that the bank 40 does not obstruct the movement of the gripper 75—with the leads 50a of the component 50 hooked in it—towards a further station, which is not illustrated since it is not relevant to this invention.

After the sleeve 51 has completed its travel and the shaft of the motor 15 has rotated 90° in the direction contrary to the previous direction of rotation, this device is reset to the initial conditions considered in order to describe its operation, conditions which are assumed to be reached at instant T11.

It is stated that the direction of rotation of the motor 15 is in relation to the magazine (mentioned above but not illustrated) from which the subsequent component 50 will come; for this purpose the motor 15 can rotate 90° in either direction with respect to its (reference) position in the station S2.

Figure 12B:
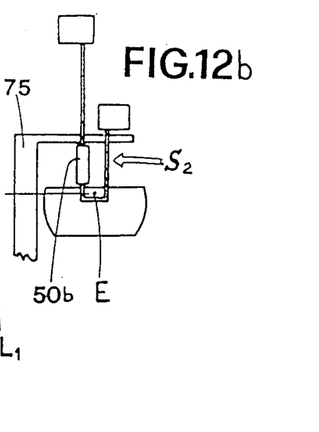

As mentioned above, FIGS. 11, 12a and 12b illustrate a second method of use of this device.

E in FIG. 11 indicates the projection of the longitudinal axis N in accordance with which the bank 40 rotates, with W being the direction in which the bank moves (in consequence of the movement of the carriage 8), L1 being the height assumed by point E during the stage of insertion (in S1 and with the carriage 8 in P1) of the component 50 into the selected station 40a, and finally L2 being the height of point E (with the bank rotated 90°) when, in S2 (with the carriage 8 in P2), the leads 50a are hooked by the gripper 75.

For this second method of use, there must be a longitudinal recess 80 in one of the bars 23, on the side of the said bar facing the first station S1, and also a third characteristic position P3 for the carriage 8 (FIG. 13) which permits the bank 40 to be positioned in the first station S1 at a height (see FIG. 11, line L3) lower than height L1 mentioned above.

In this way when component 50 is inserted into the selected bending station 40a, the body 50b of the component 50 is housed in the recess 80 whilst a lead 50a is inserted in the portions 39a in which the two corresponding grooves 39 are aligned (see FIG. 11).

At this point the action of the portions 41a of the wings 41 on the above-mentioned lead involves a double bending of the latter into two right angles (FIG. 12a): in this way the final portion of the bent lead is facing the same way as the unbent lead: the distance between the said leads is equal to the pitch P imposed by the seat 37 of the selected station 40a.

In FIG. 12a (end of bending) the bank 40 is rotated 90° with respect to FIG. 11; at this point the carriage 8 is brought from position P3 to position P1, the latter position being sufficient for the gripper 75 to hook, in station S2, the leads thus bent—this is illustrated qualitatively by a dotted line in graph G2 of FIG. 14. From the above explanation on implementing the second method of use, it is clear that there must be three characteristic positions for carriage 8.

This is obtained by means of assembly 83 in FIG. 13.

This assembly consists of a cylindrical sleeve 84, sliding inside an anti-rotation seat 89 which is integral with the carriage 5; the sleeve 84 contains two separate chambers 85 and 86 in which plungers 87 and 88 slide, whose piston rods 87a and 88a are facing in opposite directions; the rod 87a is connected to the arm 12, whilst the rod 88a is connected to the carriage 5.

With the plungers 87 and 88 in the postion shown in FIG. 13, the carriage 8 is in the P3 postion.

Actuation of the plunger 87 causes its rod 87a to move, and the carriage 8 is brought to P1.

Actuation of the plunger 88 causes the sleeve 84 to move to the right (in comparison to FIG. 13); if the plunger 87 is maintained in action, this causes the carriage 8 to move from position P1 to position P2.

In conclusion, this device makes it possible to bend the leads 50a of components 50 from the axial configuration (FIGS. 5 and 11) into either one of two final configuration (FIGS. 7, 12a and 12b) in which the leads are bent in the same direction in accordance with the selected pitch P, irrespective of the dimensions of the body 50b of the components.

In the case under examination, the bank 40 makes it possible to obtain five values of the above-mentioned pitch P; this is naturally in no way limitative since the number of bending stations 40a, hence of pitches P, may be chosen in accordance with the manufacturer's wishes or the client's specifications.

In addition to the above, it is possible to automate the feed of components 50 to the device and the discharge of components from it, with leads bent.

It is to be noted that this device is made in such a way as to require motorization units all of which assume two characteristic positions in consequence of their actuation, or otherwise; it is therefore an 'all' or 'nothing' type of regulation which can be easily interfaced with a microprocessor.

Finally this device is made in such a way as to be easily incorporated into or removed from devices of equipment whose purpose is to automatically insert the leads of components into their corresponding holes on a printed circuit board.

I claim:

1. A device for bending the leads of electric and/or electronic components supplied at a first station S1 by means 70 with leads (50a) coaxial relative to the body (50b) of the relevant component (50) and with the components having a pre-established spatial orientation characterised in that the device comprises: a bank (40) comprising a plurality of bending stations (40a) positioned side by side each for receiving an appropriate component (50), the stations being associated with corresponding fixed benders (23) and moving benders (90); selection means for longitudinally moving the bank (40) to position a selected bending station (40a) at the first station (S1); means controlling the moving benders (90) to define for them, in conjunction with the fixed benders (23): a rest position for receiving the appropriate component in the selected bending station, an intermediate position for clamping at least one lead of this component in the selected bending station (40a) in synchrony with disengagement of the first means (70) from the component (50), and lastly a final position for bending at least on lead (50a) and determining a predetermined pitch 'P' between the leads; rotating means for rotating the bank (40) of bending stations (40a) through a pre-selected angle, acting in synchrony with the means for controlling the moving benders (90), the rotating means orientating the selected bending station (40a) opposite a discharge station (S2); a first carriage (8) supporting the bank (40) and relevant selection means, the rotating means and the control means; means for moving the first carriage (8) between a first position enabling the selected bending station (40a) to be positioned in the first station (S1), and a second position, reached in synchrony with the rotating means determining the position of the selected bending station (40a) in the above-mentioned first station (S1), disengagement of the moving benders (90) from the leads (50a) component (50) occurring in the second position.

2. A device according to claim 1 characterised in that it comprises a second carriage (5), supporting the first carriage (8), moving between two end positions, one operative position O and one inoperative position I, for the above-mentioned first carriage (8).

3. A device according to either one of claims 1 and 2, characterised in that the fixed benders comprise two longitudinal bars (23) supported by a casing (22) movable longitudinally by the selection means and also rotatable about a longitudinal axis N by the rotating means, the bars (23) comprising pairs of opposite longitudinal surfaces (38) the distance between the surfaces of each pair is equal to a pre-established bending pitch P, the pairs providing for the bending stations, seats (37) for receiving the bodies (50b) of corresponding components (50), and further characterised in that the moving benders (90) include, for each seat (37), at least one pair of wings (41) orientated longitudinally and mounted on a longitudinal core (36), positioned between the said bars (23), the wings (41) being mounted for movement transversally towards each other against the action of spring units (43), the core (36) under the influence of the control means being movable outwardly of the bars (23) perpendicularly to the direction in which the bars extend, resulting in the wings (41) pressing against both the leads (50a) of the component (50) positioned in the selected bending station (40a), the leads bending in the same direction perpendicularly to the body (50b) of the relevant component (50) in accordance with the bending pitch P of the seat (37) of the selected bending station (40a).

4. A device to claim 3 characterised in that the means for moving the first carriage (8) comprises at least one rack (9) integral with the carriage (8) meshing with a pinion (10) carried by a shaft (11) supported for rotary movement by means (12, 13, 13a) so as to permit, in the first end position (P1) of the carriage (8), the insertion of the body (50b) of the components (50) positioned in the said first station (S1) into the seat (37) relating to the selected bending station (40a).

5. A device according to either one of claims 1 and 2 characterised in that the fixed benders comprise two longitudinal bars (23) supported by a casing (22) movable longitudinally by the selection means and also rotatable about a longitudinal axis N, by the rotating means, the bars (23) comprising pairs of opposite longitudinal surfaces (38) providing seats (37), each associated with one of the stations (40a), with the distance between the opposite surfaces (38) of each seat (37) being equal to a pre-established bending pitch P, at least one of the bars comprising a longitudinal recess (80) for receiving the body (50b) of the component (50) positioned in the selected bending station (40a) and further characterised in that the moving benders (90) include, for each seat (37), one pair of wings (41) orientated longitudinally and mounted on a longitudinal core (36), positioned between the said bars (23), the wings (41) being mounted for movement transversely towards each other against the action of spring units (43), the core (36) under the influence of the control means being movable outwardly of the bars (23) perpendicularly to the direction in which the bars extend, resulting in the wings (41) pressing against only one lead (50a) of the component positioned in the selected bending station with double bending of the lead (50a) through 180° with respect to the axis of the relevant body (50b) and in accordance with the bending pitch P of the seat (37) of the said selected bending station (40a).

6. A device according to claim 4, characterised in that the control means comprises a parallelogram linkage (28) one side (30) of which supports the core (36) whilst the opposite side (27) is secured to a longitudinal rod (26), the side (27) having a pin (31) slideable in a slot (32) in the casing (22), the rod (26) being movable axially with respect to the casing rod (26) being movable axially with respect to the casing between two extreme positions determined by the pin (31) abutting opposite ends of the slot (32); a rack (34) carried by an arm held by a bush (25) in which the rod (26) is inserted and axially guided associated with the casing (22) and movable axially relative to the casing over a distance exceeding the axial travel of the rod (26) relative to the casing (22), the rack (34) meshing with a toothed section (33) of one of the connecting rods (29) linkage the sides (27, 20) of the linkage (28); and means for operating the rod (26) and bush (25), acting in synchrony with the rotating means.

7. A device according to claim 6 characterised in that the means for operating the rod (26) and bush (25) comprises a sleeve (51) encircling the bush (25), internally comprising a groove (49) in which is received an end portion (48a) of a pin (48) keyed onto the bush (25); means (53) for axially moving the sleeve (51), itself movable longitudinally as a result of the action of the selection means; a peg (47) passing through a hole in the wall of the bush (25), whose end is urged against the rod (26) by resilient means with the possibility of the end engaging in one or other of two notches (46a, 46b) in the rod (26), the distance between the notches (46a, 46b) being equal to the difference between the axial travel of the bush (25) and the axial travel of the rod (26).

8. A device according to claim 7 characterised in that the axial travel imposed by the means (53) for the axial movement of the sleeve (51) is less than the maximum travel estimated for the bush (25), and in that the groove (49) is helical with pitch such as to permit the bush (25), in consequence of the pre-established rotation imposed on the casing (22) by the rotating means, to make an axial movement equal to the difference between the above-mentioned maximum travel and the travel imposed by the relevant means units (53).

9. A device according to claim 8 characterised in that the rotating means comprises a shaft (21) of which one end supports the casing (22) and the other end is connected to a metal tube (17) with the possibility of moving axially with respect to the tube (17), and in that the devices comprises means (15) by which the metal tube (17) can be rotated in either direction by an angle equal to the pre-selected angle, the shaft (21) being axially movable by means of the selection means.

10. A device according to claim 9, characterised in that the selection means comprises a slide (54) slideable longitudinally on suitable slideways (55), a collar (59) keyed to the shaft (21) and supporting the casing (22); a roller (57) carried by the slide, positioned in an annular groove (58) on the outside of the collar (59), means (60) for axially moving the slide; a plurality of moving tappets 62b–e, each actuated by associated means (63b–e) which can be operated independently of one another, each of the said moving tappets, in its working position intercepting a ledge (61) in the slide whereby to position an associated one of the bending station (40a) of the bank (40) at the first station (S1).

11. A device according to claim 10 characterised in that the means (53) for axially moving the sleeve (51) are supported by the slide (54).

12. A device according to claim 11 characterised in that the sleeve (51) is integral with an arm (67) which supports a pin (65) arranged to pass along corresponding grooves (64) in a shoulder (59a) of the collar (59) in consequence of axial movement of the sleeve, and to press against an internal surface of the shoulder during the rotation of the shaft (21) supporting the casing (22).

13. A device according to claim 4 characterised in that the means for moving the first carriage (8) comprises at least one rack (9) integral with the carriage (8) with a pinion (10) carried by a shaft (11) supported by the second carriage (5) with the pinion rotated by means (83) so as to permit in an end position (P3) of the first carriage (8), the insertion of the body of the component (50) positioned in the first station (S1) into the longitudinal recess (80) in one of the longitudinal bars (23).

14. A device according to claim 13 characterised in that the front portions (41a) of the wings (41) are associated with the seat of the relevant bending station, with the portions (41a) being responsible for intercepting, and bending, at least one lead (50a) of the component inserted in the selected bending station and in that the rear portion (41b) of the wings (41) are associated with a seat (37) of a bending station (40a) adjacent to the preceding bending station, with the said rear portions (41b) situated in accordance with staggered longitudinal planes in accordance with the longitudinal planes of the corresponding front portions (41a); the front portions (41a), and rear portions (41b), of two consecutive pairs of wings (41), defining an inlet (45) for at least one lead (50a) of the component (50) inserted in the selected bending station (40a).

15. A device according to claim 14 characterised in that in the above-mentioned core (36) there are at least two stops (44) intercepted, at rest, by the corresponding wings (41) of the same pair of benders (90) with the consequent determination of the maximum distance between the wings.

16. A device according to claim 15 characterised in that the connection between the core (36) and the pairs of wings (41) is obtained by means of at least one pin (42) carried by a corresponding protuberance (36a) of the core (36).

17. A device according to claim 15 characterised in that in each bending station (40a), there are two grooves (39), symmetrical in relation to a plane perpendicular to the axis N about which the bank (40) rotates, each of which comprises the top surface (23a) of the corresponding bar (23) and the longitudinal surface (38) of the seat (37) associated with the bending station, the said grooves (39) determining an inlet for the leads (50a) for when the component (50) is inserted into the bending station and a guide for when the leads slide during bending.

18. A device according to claim 17 characterised in that it includes, aligned with the opposite stretches of the said grooves (39), stop tappets (95), coaxial with respect to each other, for intercepting the leads during bending of the latter.

19. A device according to claim 18 characterised in that the core (36) includes for each pair of wings (41) two longitudinal stops for the said wings (41) to limit movement of the wings towards each other during bending of the leads.

20. A machine according to claim 19 characterised in that it comprises a discharge station (S2) having means (75) to engage components (50) after the leads (50a) have been bent and remove them from the discharge station, disengagement of the moving benders (90) from the leads (50a) being synchronized with operation of the discharge means (75).

21. A machine according to claim 20 characterised in that the means (70) is arranged to intermittently supply components (59) to the appropriate bending station (40a) and the discharge means (75) to intermittently remove components from the station (40a) on completion of bending.

* * * * *